(12) United States Patent
Hsu et al.

(10) Patent No.: US 9,741,646 B2
(45) Date of Patent: Aug. 22, 2017

(54) PACKAGE SUBSTRATE AND ITS FABRICATION METHOD

(71) Applicant: PHOENIX PIONEER TECHNOLOGY CO., LTD., Hsinchu County (TW)

(72) Inventors: Chin-Yao Hsu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 344 days.

(21) Appl. No.: 14/451,892

(22) Filed: Aug. 5, 2014

(65) Prior Publication Data

US 2016/0043025 A1 Feb. 11, 2016

(30) Foreign Application Priority Data

May 30, 2014 (TW) .............................. 103118993 A

(51) Int. Cl.
*H01R 9/00* (2006.01)
*H05K 3/00* (2006.01)
*H01L 23/498* (2006.01)
*H01L 21/48* (2006.01)

(52) U.S. Cl.
CPC ...... *H01L 23/49811* (2013.01); *H01L 21/486* (2013.01); *H01L 23/49827* (2013.01); *H01L 2924/0002* (2013.01); *Y10T 29/49147* (2015.01)

(58) Field of Classification Search
CPC ......... H01L 23/49811; H01L 23/49827; H01L 21/486; H01L 2924/0002; H01L 2924/00; Y10T 29/49126; Y10T 29/49155; Y10T 29/49204
USPC .................. 29/830, 832, 842, 846, 852, 874; 174/262
See application file for complete search history.

(56) References Cited

U.S. PATENT DOCUMENTS

| | | | | |
|---|---|---|---|---|
| 4,831,495 A * | 5/1989 | Harding | .................. | H01L 21/50 29/825 |
| 5,200,366 A * | 4/1993 | Yamada | ............ | B29C 45/14655 29/841 |
| 8,952,268 B2 * | 2/2015 | Hu | ......................... | C25D 1/003 174/262 |

* cited by examiner

*Primary Examiner* — Donghai D Nguyen
(74) *Attorney, Agent, or Firm* — WPAT, PC

(57) ABSTRACT

This disclosure provides a package substrate and its fabrication method. The package substrate includes: a carrier; a first wiring layer formed on the carrier; a conductive pillar layer having a plurality of metal pillars on the first wiring layer; a molding compound layer formed on the first wiring layer, covering all the first wiring layer and the metal pillars, and exposing one end face of each metal pillar; a second wiring layer formed on the molding compound layer and the exposed end faces of the metal pillars; and a protection layer formed on the second wiring layer.

7 Claims, 5 Drawing Sheets

PACKAGE SUBSTRATE AND ITS FABRICATION METHOD

This application claims the benefit of Taiwan application Serial No. 103118993, filed May 30, 2014, the disclosure of which is incorporated by reference herein in its entirety.

TECHNICAL FIELD

The present disclosure relates to a package substrate and its fabrication method.

TECHNICAL BACKGROUND

A next-generation electronic product is asked to have multiple functions and high-speed performance other than compactness. The integrated-circuit manufacturers have moved to smaller design rules to make chips with much more electronic devices. On the other hand, the techniques for packaging the chips or semiconductor substrates have also been developed for the same purpose.

Conventionally, the molding compound layer in a package substrate is formed by using transfer molding or injection molding. For example, FIGS. 1A to 1C show cross-sectional views of a package substrate in different steps of a prior-art fabrication process. The package substrate has a wiring layer 12 and metal pillars 13 on a carrier 11, as shown in FIG. 1A. Before the formation of molding compound layers 14 on the wiring layer 12 and the metal pillars 13, the top surface of the carrier 11 is divided into grid regions. The molding compound layers 14 are formed in turn by molding and each of the molding compound layers 14 is located in a grid region. A molding compound layer 14 can be formed on the wiring layer 12 and the metal pillars 13 in the left region of the carrier 11 as shown in FIG. 1B. Then another molding compound layer 14 can be formed on the wiring layer 12 and the metal pillars 13 in the right region of the carrier 11 as shown in FIG. 1C. Thus, gaps or recesses may be formed between the neighboring molding compound layers 14 and they may introduce chemical contamination caused by the dielectric processing in the subsequent fabrication process and the possible baring of the carrier 11. And the multiple-step molding process may require more processing time. Therefore, it is in need to develop a new means for fabricating package substrates.

TECHNICAL SUMMARY

According to one aspect of the present disclosure, one embodiment provides a package substrate, which includes: a carrier; a first wiring layer formed on the carrier; a conductive pillar layer having a plurality of metal pillars on the first wiring layer; a molding compound layer formed on the first wiring layer, covering all the first wiring layer and the metal pillars, and exposing one end face of each metal pillar; a second wiring layer formed on the molding compound layer and the exposed end faces of the metal pillars; and a protection layer formed on the second wiring layer.

According to another aspect of the present disclosure, another embodiment provides a method of fabricating a package substrate, which includes: (A) providing a carrier; (B) forming a first wiring layer on the carrier; (C) forming a conductive pillar layer having a plurality of metal pillars on the first wiring layer; (D) forming a molding compound layer which covers all the first wiring layer and the metal pillars on the carrier; (E) exposing the metal pillars by removing a part of the molding compound layer; (F) forming a second wiring layer on the molding compound layer and the exposed parts of the metal pillars; and (G) forming a protection layer on the second wiring layer. Wherein, step (D) is processed for only one time.

In one embodiment, step (B) may include: forming and patterning a first photoresist layer on the carrier; forming a first metal layer on the first photoresist layer; and removing the first photoresist layer and concurrently patterning the first metal layer to form the first wiring layer.

In one embodiment, step (C) may include: forming and patterning a second photoresist layer on the carrier; forming a second metal layer on the second photoresist layer; and removing the second photoresist layer and concurrently patterning the second metal layer to form the metal pillars.

In one embodiment, step (D) may include: providing a molding compound in a mold container; and pressing the mold container against the carrier and concurrently curing the molding compound to form the molding compound layer.

In one embodiment, step (D) may include: providing a mold container and a molding compound in the form of powder or sheet; melting the molding compound and loading it into the mold container; and pressing the mold container against the carrier and concurrently curing the molding compound to form the molding compound layer.

In one embodiment, step (E) may include: polishing the molding compound layer to remove it downwards until the exposure of top faces of the metal pillars.

In one embodiment, step (F) may include: forming and patterning a third photoresist layer on the molding compound layer; forming a third metal layer on the third photoresist layer; and removing the third photoresist layer and concurrently patterning the third metal layer to form the second wiring layer.

In one embodiment, the molding compound layer is formed of a material selected from the group consisting of novolac-based resin, epoxy-based resin, and silicone-based resin.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For further understanding and recognizing the fulfilled functions and structural characteristics of the disclosure, several exemplary embodiments cooperating with detailed description are presented as the following. Reference will now be made in detail to the preferred embodiments, examples of which are illustrated in the accompanying drawings.

In the following description of the embodiments, it is to be understood that when an element such as a layer (film), region, pattern, or structure is stated as being "on" or "under" another element, it can be "directly" on or under another element or can be "indirectly" formed such that an intervening element is also present. Also, the terms such as "on" or "under" should be understood on the basis of the drawings, and they may be used herein to represent the relationship of one element to another element as illustrated in the figures. It will be understood that this expression is intended to encompass different orientations of the elements in addition to the orientation depicted in the figures, namely, to encompass both "on" and "under". In addition, although the terms "first", "second" and "third" are used to describe various elements, these elements should not be limited by the term. Also, unless otherwise defined, all terms are intended to have the same meaning as commonly understood by one of ordinary skill in the art.

Figure 2:
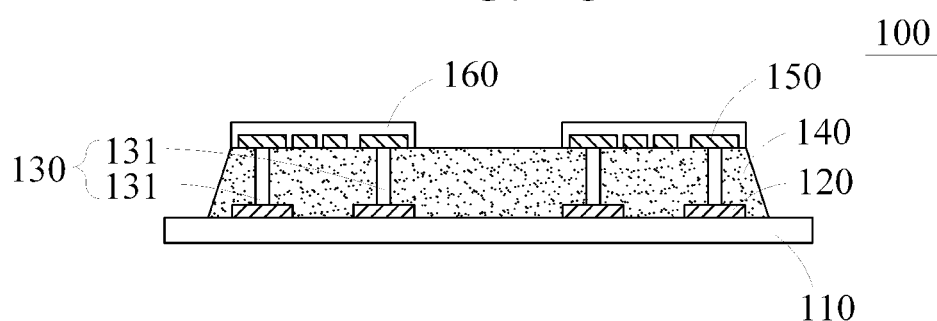
FIG. 2 is a cross-sectional view of a package substrate according to one embodiment of the present disclosure.

FIG. 2 schematically shows a cross-sectional view of a package substrate 100 according to one embodiment of the present disclosure. The package substrate 100 includes a carrier 110, a first wiring layer 120, a conductive pillar layer 130, a molding compound layer 140, a second wiring layer 150, and a protection layer 160. Wherein, the carrier 110 is used to carry and support electronic components and conductive wires of the package substrate 100, and it may be made of metal or fiberglass in the embodiment. The first wiring layer 120 is a layer of conductive material formed on the carrier 110 and patterned to be a part of the conductive wires of the package substrate 100. The conductive wires may be made of metal in the embodiment. The conductive pillar layer 130 is a layer of conductive material formed on the first wiring layer 120 and patterned to be a plurality of metal pillars 131, which are used to electrically connect the first wiring layer 120 and the second wiring layer 150. The metal pillars 131 may be made of copper in the embodiment. The molding compound layer 140 acts as an insulation layer between the first wiring layer 120 and the second wiring layer 150. The molding compound layer 140 may cover all the first wiring layer 120 and the conductive pillar layer 130 while expose one end face of each metal pillar 131, so that the metal pillars 131 can connect the first wiring layer 120 and the second wiring layer 150. The molding compound layer 140 can be made of insulating material suitable for compression molding, such as novolac-based resin, epoxy-based resin, and silicone-based resin. The second wiring layer 150 is formed on the molding compound layer 140 and the exposed end faces of the metal pillars 131, and patterned to be another part of the conductive wires of the package substrate 100. The protection layer 160 is formed on the second wiring layer 150 and the molding compound layer 140, so as to protect the second wiring layer 150 from being damaged by external objects or the subsequent fabrication process. The package substrate 100 can be a flip-chip chip size package (FCCSP) substrate used to construct the so-called "molded interconnection substrate (MIS)".

Figure 3:
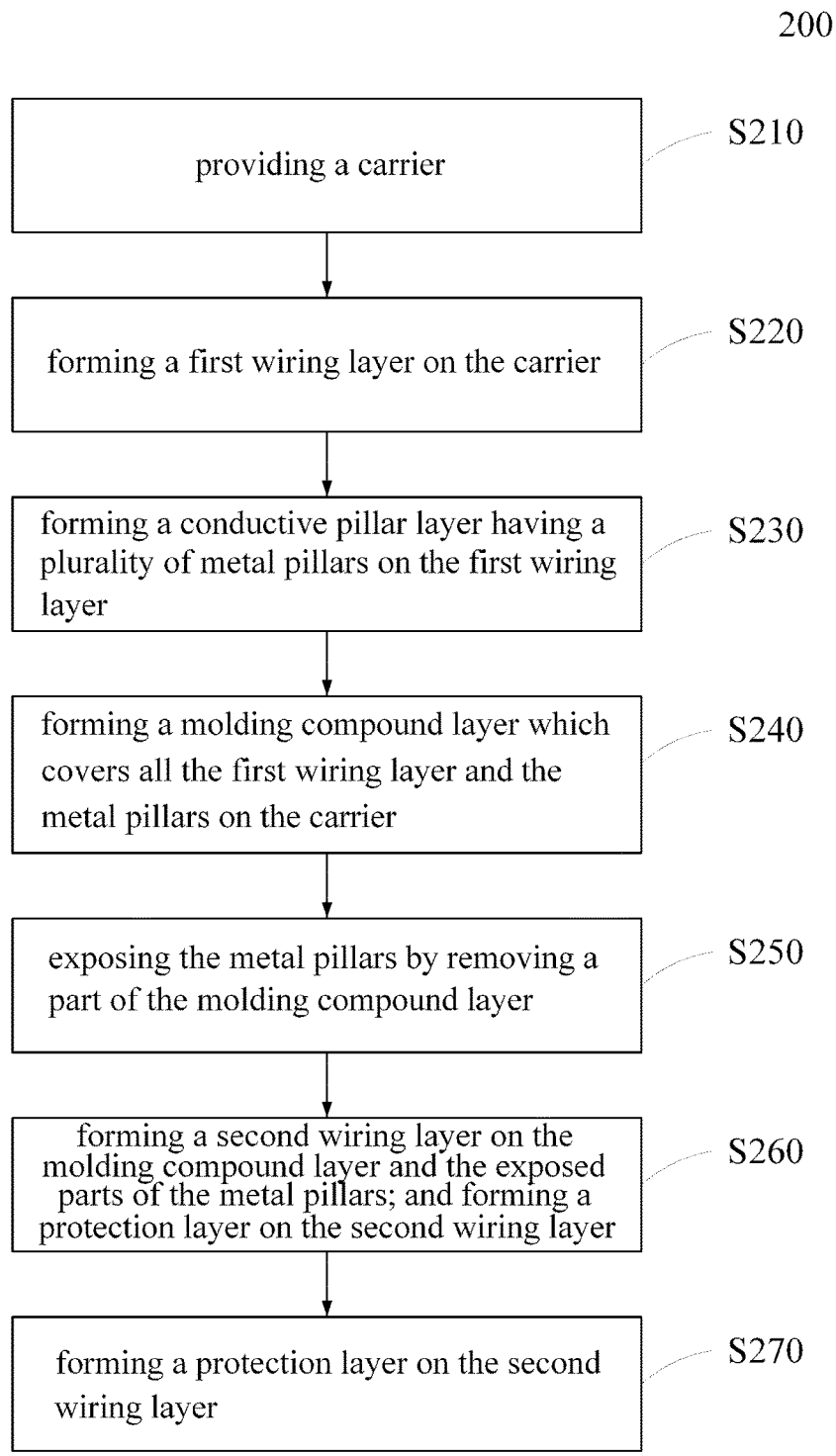
FIG. 3 is a flowchart of a method for fabricating a package substrate.

FIG. 3 shows a flowchart of a method 200 for fabricating a package substrate, and FIGS. 4A to 4F are cross-sectional views of the package substrate according to the embodiment of FIG. 2 of the present disclosure, corresponding to steps S210 to S260 in the fabrication process. The method 200 will be described in detail in the following paragraphs.

Figure 4A:
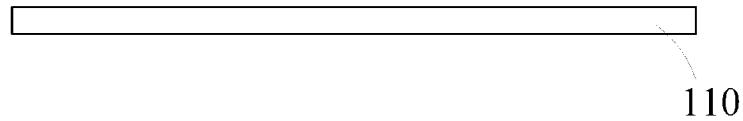
FIGS. 4A to 4F are cross-sectional views of the package substrate according to the embodiment of FIG. 2 of the present disclosure, corresponding to different steps in the fabrication process.

At step S210, a carrier 110 is provided as shown in FIG. 4A to carry and support electronic components and conductive wires of the package substrate 100, e.g. the first wiring layer 120, the conductive pillar layer 130, the molding compound layer 140, the second wiring layer 150, and the protection layer 160 in FIG. 2. The carrier 110 is made of metal or fiberglass in the embodiment.

Figure 4B:
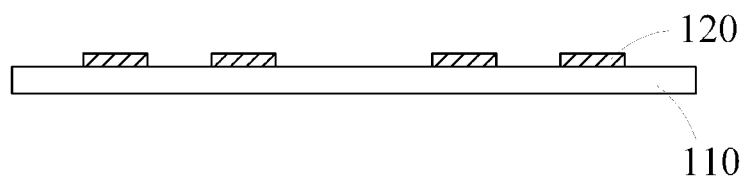

At step S220, a first wiring layer 120 is formed on the carrier 110 and then patterned to be a part of the conductive wires of the package substrate 100, as shown in FIG. 4B. The first wiring layer 120 can be made of copper or aluminum and formed by evaporating or electrolytic plating. The first wiring layer 120 can be patterned by the photolithography. For example, a first photoresist layer (not shown) can be deposited on the carrier 110 by spin-coating, and it would be patterned by exposure to light and developing. Then, a first metal layer (not shown) is deposited on the patterned first photoresist layer. By using the lift-off processing, the patterned first photoresist layer can be washed out together with the part of the first metal layer directly on its top surface, and the rest of the first metal layer not on the patterned first photoresist layer stays on the carrier 110 to be the first wiring layer 120 in the embodiment.

Figure 4C:
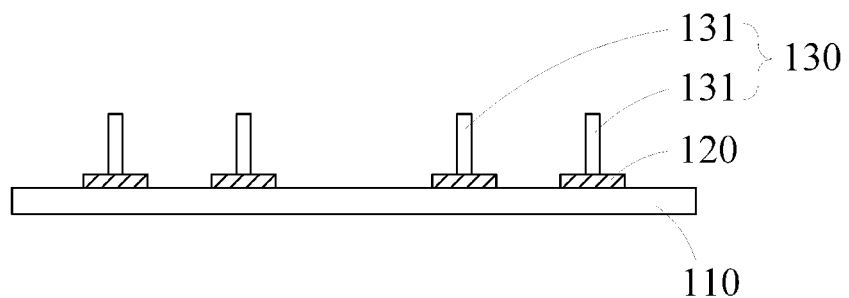

At step S230, a conductive pillar layer 130 is formed on the first wiring layer 120 and then patterned to be a plurality of metal pillars 131 as shown in FIG. 4C. The metal pillars 131 are used to electrically connect the first wiring layer 120 and the second wiring layer 150 to be proceeded in the subsequent fabrication steps. The metal pillars 131 can be made of copper or aluminum and formed by evaporating or electrolytic plating. The conductive pillar layer 130 can be patterned by the photolithography. For example, a second photoresist layer (not shown) can be deposited on both the carrier 110 and the first wiring layer 120 by laminating dry film photoresist, and it would be patterned by exposure to light and developing. Then, a second metal layer (not shown) is deposited on the patterned second photoresist layer. By using the lift-off processing, the patterned second photoresist layer can be removed out together with the part of the second metal layer directly on its top surface, and the rest of the second metal layer not on the patterned second photoresist layer stays on the first wiring layer 120 to be the metal pillars 131 of the conductive pillar layer 130 in the embodiment.

Figure 4D:
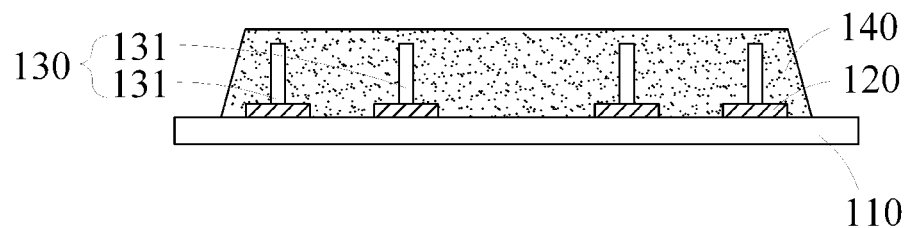
Figure 5A:
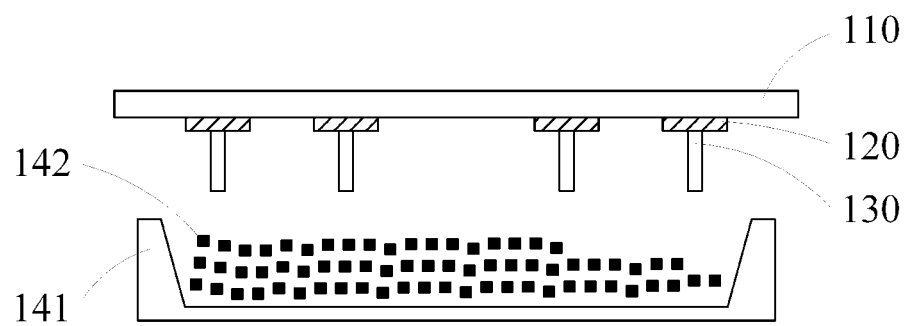
FIGS. 5A and 5B are schematic plots of the formation of the molding compound layer by compression molding.
Figure 5B:
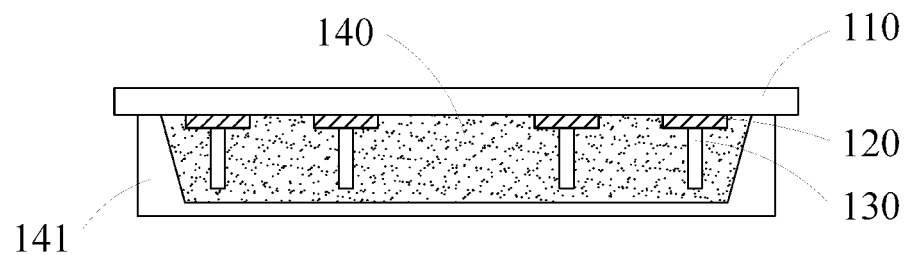

At step S240, a molding compound layer 140 is formed on the carrier 110, and it covers all the top surface of the carrier 110 including the first wiring layer 120 and all the metal pillars 131 of the conductive pillar layer 130, as shown in FIG. 4D. It serves as an insulation layer between the first wiring layer 120 and the second wiring layer 150. The molding compound layer 140 can be formed by compression molding as shown in FIGS. 5A and 5B. At first, a molding compound 142 is provided in a mold container 141. The mold container 141 corresponds with the carrier 110 properly, so that the first wiring layer 120, the metal pillars 131 and the molding compound 142 are all located between the mold container 141 and the carrier 110, as shown in FIG. 5A. Then, a downward pressure is applied to the carrier 110 and an upward pressure is applied to the mold container 141. The pressures are maintained until the molding compound 142 has cured to be the molding compound layer 140 as shown in FIG. 5B. The mold container 141 can be removed after that. Alternatively, the molding compound layer 140 can be compression-molded in another way. At first, a mold container 141 and a molding compound 142 in the form of powder or sheet are provided. The molding compound 142 can be melted by heating and loaded into the mold container 141. Then the mold container 141 and the carrier 110 are arranged correspondingly, so that the first wiring layer 120, the metal pillars 131 and the molding compound 142 are located between the mold container 141 and the carrier 110, as shown in FIG. 5A. Then a downward pressure is applied to the carrier 110 and an upward pressure is applied to the mold container 141. The pressures are maintained until the molding compound 142 has cured to be the molding compound layer 140 as shown in FIG. 5B. The mold container 141 can be removed after that. The molding compound layer 140 can be made of insulating material suitable for compression molding, such as novolac-based resin, epoxy-based resin, and silicone-based resin; but is not limited thereto.

Figure 1A:
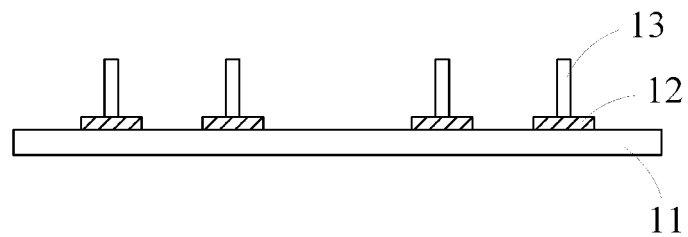
FIGS. 1A to 1C are cross-sectional views of a package substrate in different steps of a prior-art fabrication process.
Figure 1B:
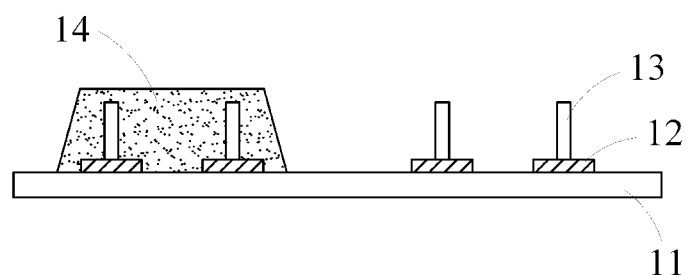
Figure 1C:
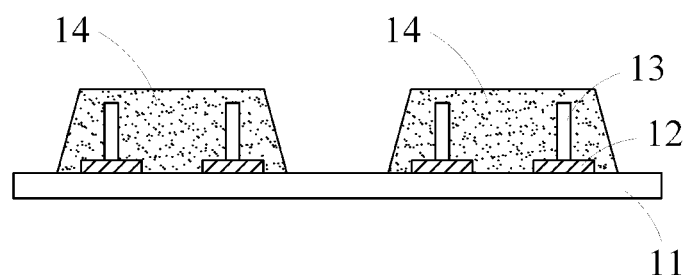

Compared with the prior art of fabricating a package substrate as shown in FIGS. 1A to 1C, the molding compound layer 140 of the present disclosure is formed on the carrier 110 in only one single fabrication step, S240, and it covers the whole of the top surface of the carrier 110. On the contrary, multiple molding compound layers 14 are formed on the carrier 11; wherein, each of the molding compound layers 14 is located in a grid and is formed in turn, as shown in FIGS. 1A to 1C. That is to say, the molding compound layers 14 in the prior art are formed on the carrier 11 one by one in multiple steps like S240, so that they can cover the whole of the top surface of the carrier 11. Also, gaps or recesses may be formed between the neighboring molding compound layers 14 and they may introduce chemical contamination in the fabrication process. These problems can be avoided according to the embodiment of the present disclosure.

Figure 4E:
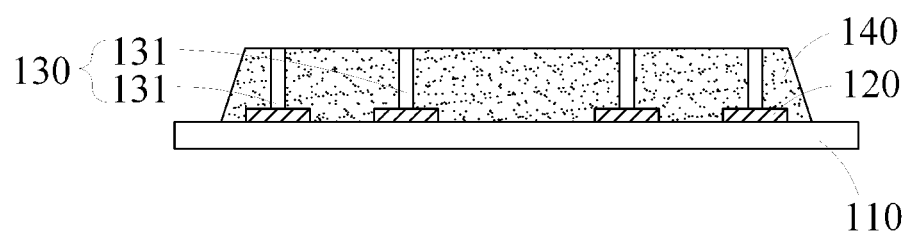

At step s250, the metal pillars 131 are exposed by removing a part of the molding compound layer 140, as shown in FIG. 4E. Although the molding compound layer 140 serves as an insulation layer between the first wiring layer 120 and the second wiring layer 150, they are electrically connected with each other by the metal pillars 131. The molding compound layer 140 covers all the first wiring layer 120 and all the metal pillars 131 on the carrier 110 after step S240. In order to connect the first wiring layer 120 and the second wiring layer 150, the upper part of the molding compound layer 140 has to be removed to expose top faces of the metal pillars 131. The removal can be realized by polishing or grinding, such as the chemical mechanical polishing (CMP) process. The molding compound layer 140 is polished to remove its upper part downwards until the exposure of the top faces of the metal pillars 131. In another embodiment, it can be designed to expose the top faces of the metal pillars 131 in the formation of the molding compound layer 140. If so, the removal in step S250 can be omitted.

Figure 4F:
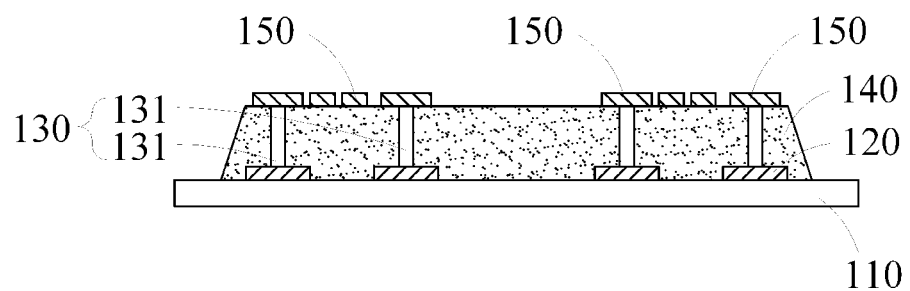

At step S260, a second wiring layer 150 is formed on the molding compound layer 140 and the exposed top faces of the metal pillars 131, and then patterned to be another part of the conductive wires of the package substrate 100, as shown in FIG. 4F. The second wiring layer 150 can be made of copper or aluminum and formed by evaporating or electrolytic plating. The second wiring layer 150 can be patterned by the photolithography. For example, a third photoresist layer (not shown) can be deposited on the molding compound layer 140 by spin-coating, and it would be patterned by exposure to light and developing. Then, a third metal layer (not shown) is deposited on the patterned third photoresist layer. By using the lift-off processing, the patterned third photoresist layer can be washed out together with the part of the third metal layer directly on its top surface, and the rest of the third metal layer not on the patterned third photoresist layer stays on the molding compound layer 140 to be the second wiring layer 150 in the embodiment.

At step S270, a protection layer 160 is formed on the second wiring layer 150 and the molding compound layer 140. The protection layer 160 is used to electrically insulate the neighboring conductive wires of the second wiring layer 150 and to protect the second wiring layer 150 from being damaged by external objects or the subsequent fabrication process. Moreover, the package substrate 100 of the embodiment can be further processed to be a packaged integrated-circuit device. For example, the protection layer 160 can be patterned by using the photolithography to expose a part of the second wiring layer 150, so that it can be connected to an external circuit (not shown). Alternatively, the so-called "backend processing" can be applied to the package substrate 100 of the embodiment. For example, a part of the lower part of the carrier 110 can be removed by using the photolithography to form an opening (not shown) exposing the first wiring layer 120 and the molding compound layer 140, so that an external electronic device (not shown) can be mounted in the opening with electrical connection to the first wiring layer 120.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:
1. A method of fabricating a package substrate, comprising:
   (A) providing a carrier, comprising a top surface;
   (B) forming a first wiring layer, comprising a plurality of conductive wires on the top surface of the carrier;
   (C) forming a conductive pillar layer having a plurality of metal pillars on the first wiring layer, wherein each metal pillar has a width different from that of each conductive wire;
   (D) providing a mold container and an epoxy-based molding compound in the form of powder or sheet, melting the epoxy-based molding compound and loading the epoxy-based molding compound into the mold container, and pressing the mold container against carrier and concurrently curing the epoxy-based molding compound to form an epoxy-based molding compound layer which covers all the first wiring layer and the metal pillars on the carrier in a single step, wherein the epoxy-based molding compound layer covers the first wiring layer, the metal pillars on the carrier, and the top surface of the carrier;
   (E) exposing the metal pillars by removing a part of the epoxy-based molding compound layer;
   (F) forming a second wiring layer on the epoxy-based molding compound layer and the exposed parts of the metal pillars; and
   (G) forming a protection layer on the second wiring layer.

2. The method according to claim 1, wherein the step (B) comprises:

forming and patterning a first photoresist layer on the carrier;

forming a first metal layer on the first photoresist layer; and removing the first photoresist layer and concurrently patterning the first metal layer to form the first wiring layer.

3. The method according to claim 1, wherein the step (C) comprises:

forming and patterning a second photoresist layer on the carrier;

forming a second metal layer on the second photoresist layer; and removing the second photoresist layer and concurrently patterning the second metal layer to form the metal pillars.

4. The method according to claim 1, wherein the step (E) comprises:

polishing the epoxy-based molding compound layer to remove the epoxy-based molding compound layer downwards until the exposure of top faces of the metal pillars.

5. The method according to claim 1, wherein the step (F) comprises:

forming and patterning a third photoresist layer on the epoxy-based molding compound layer;

forming a third metal layer on the third photoresist layer; and removing the third photoresist layer and concurrently patterning the third metal layer to form the second wiring layer.

6. The method according to claim 1, wherein the protective layer is formed on the second wiring layer to completely cover the second wiring layer on an opposite side of the epoxy-based molding compound layer and the exposed parts of the metal pillars.

7. The method according to claim 1, wherein the epoxy-based molding compound layer has a shape according to the molding container.

* * * * *